United States Patent [19]

Takahashi et al.

[11] Patent Number: 5,549,716
[45] Date of Patent: Aug. 27, 1996

[54] PROCESS FOR MANUFACTURING INTEGRATED CIRCUITS USING AN AUTOMATED MULTI-STATION APPARATUS INCLUDING AN ADHESIVE DISPENSER AND APPARATUS THEREFOR

[75] Inventors: Tetsuo Takahashi; Eisaku Miyauchi; Kunio Mogi, all of Akita-Ken; Shinichi Araya, Honjou, all of Japan

[73] Assignee: TDK Corporation, Japan

[21] Appl. No.: 46,151

[22] Filed: Apr. 13, 1993

[51] Int. Cl.⁶ .......................... H01L 21/58; H01L 21/60; H01L 21/71

[52] U.S. Cl. .......................... 29/25.01; 437/7; 437/207; 437/926; 156/64

[58] Field of Search .................. 437/207, 7, 926; 156/64; 29/833, 25.01

[56] References Cited

U.S. PATENT DOCUMENTS

| | | | |
|---|---|---|---|
| 3,649,354 | 3/1972 | Te Velde | 437/185 |
| 4,173,821 | 11/1979 | Yamamoto et al. | 264/234 |
| 4,209,898 | 7/1980 | Aoki et al. | 29/783 |
| 4,283,847 | 8/1981 | May | 29/832 |
| 4,292,116 | 9/1981 | Takahashi et al. | 156/566 |
| 4,301,958 | 11/1981 | Hatakenaka et al. | 228/4.5 |
| 4,493,939 | 1/1985 | Blaske et al. | 29/841 |
| 4,619,043 | 10/1986 | Takahashi et al. | 29/840 |
| 4,805,110 | 2/1989 | Takahashi et al. | 364/468 |
| 4,817,849 | 4/1989 | Yamamoto et al. | 29/593 |
| 4,850,103 | 7/1989 | Takemoto et al. | 29/827 |
| 4,851,902 | 7/1989 | Tezuka et al. | 358/101 |
| 4,910,866 | 3/1990 | Allen | 29/463 |
| 4,941,255 | 7/1990 | Bull | 29/407 |
| 5,023,202 | 6/1991 | Long et al. | 437/217 |
| 5,113,565 | 5/1992 | Cipolla et al. | 437/220 |
| 5,173,766 | 12/1992 | Long et al. | 257/687 |
| 5,187,123 | 2/1993 | Yoshida et al. | 437/220 |

FOREIGN PATENT DOCUMENTS

| | | | |
|---|---|---|---|
| 0042977 | 1/1982 | European Pat. Off. | 29/25.01 |
| 6063937 | 4/1985 | Japan | 29/25.01 |
| 6063936 | 4/1985 | Japan | 29/25.01 |
| 61101034 | 4/1986 | Japan | 29/25.01 |
| 6173339 | 4/1986 | Japan | 437/7 |
| 6381935 | 4/1988 | Japan | 29/25.01 |
| 63314838 | 12/1988 | Japan | 29/25.01 |
| 148431 | 2/1989 | Japan | 29/25.01 |
| 1100928 | 4/1989 | Japan | 156/64 |
| 1140636 | 6/1989 | Japan | 29/25.01 |

*Primary Examiner*—Mary Wilczewski
*Assistant Examiner*—David E. Graybill
*Attorney, Agent, or Firm*—Lerner, David, Littenberg, Krumholz & Mentlik

[57] ABSTRACT

A process for manufacturing an electronic component and an apparatus therefor capable of permitting die-bonding, wire-bonding and molding to be successively executed on a through-line. Die-bonding for adhesively mounting IC chips on a lead frame, wire-bonding for connecting bonding pads of the IC chips and the lead frame to each other through lead wires, and molding for forming a resin material into an outer package for covering each of the IC chips are successively executed on a through-line while transferring the lead frame by means of a conveyor.

7 Claims, 5 Drawing Sheets

PROCESS FOR MANUFACTURING INTEGRATED CIRCUITS USING AN AUTOMATED MULTI-STATION APPARATUS INCLUDING AN ADHESIVE DISPENSER AND APPARATUS THEREFOR

BACKGROUND OF THE INVENTION

This invention relates to a process for manufacturing an electronic component having an outer package made of a resin material such as an integrated circuit or the like and an apparatus therefor, and more particularly to a process for manufacturing an electronic component of diversified small-quantity production such as an integrated circuit for specific applications called ASIC and an apparatus therefor.

A process for manufacturing an electronic component which has been conventionally practiced in the art generally includes a die-bonding step of adhesively mounting integrated circuit chips (hereinafter referred to as "IC chips") on a lead frame, a wire-bonding step of connecting bonding pads of the IC chips and the lead frame to each other by means of lead wires, and a molding step of forming a resin material into an outer package for covering a periphery of each of the IC chips. In the conventional process, the steps are executed independent from each other. Thus, in the conventional process, it is required to arrange a number of identical equipments at every step and execute the steps independently from each other.

Recently, high densification and thinning of integrated circuits have been well in progress. Concurrently, it is extensively desired to realize dust-free environment and unmanning for continuous operation over twenty-four hours a day and develop a production line capable of effectively accommodating diversified small-quantity production which is carried out with respect to specific electronic components such as ASIC and the like.

Unfortunately, the conventional process requires time and labor for storing and transferring semi-finished products in the course of manufacturing because the respective steps of the process are executed separate from each other, resulting in failing in unmanning and to accommodate diversified small-quantity production.

In order to eliminate the above-described disadvantages, it is attempted in the art to promote in-line execution of both die-bonding step and wire-bonding for the purpose of realizing unmanning. However, a wire bonder for executing the wire-bonding step is inferior in productivity to a die bonder for executing the die-bonding step, so that it is required to arrange three or five wire bonders for every die bonder in order to form a line. The line thus formed exhibits an advantage when a production lot size is increased as seen in production of memories; however, it causes a decrease in operating efficiency when a production lot size is reduced as seen in diversified small-quantity production such as production of ASIC, because it frequently requires a change in arrangement or program. Further, at the present time, application of such in-line is limited to a combination of the die-bonding and wire-bonding, therefore, the molding step must be excluded from the in-line.

SUMMARY OF THE INVENTION

The present invention has been made in view of the foregoing disadvantages of the prior art.

Accordingly, it is an object of the present invention to provide a process for manufacturing an electronic component which is capable of continuously manufacturing electronic components on a through-line, i.e., a conveyor belt or similar in-line carrier for continuously moving the electronic component to and from each successive step.

It is another object of the present invention to provide a process for manufacturing an electronic component which is capable of accomplishing labor saving and effectively accommodating diversified small-quantity production.

It is a further object of the present invention to provide a process for manufacturing an electronic component which is capable of executing a molding step together with a die-bonding step and a wire-bonding step on a through-line.

It is still another object of the present invention to provide an apparatus for manufacturing an electronic component which is capable of continuously manufacturing electronic components on a through-line.

It is a still further object of the present invention to provide an apparatus for manufacturing an electronic component which is capable of accomplishing labor saving and effectively accommodating diversified small-quantity production.

In accordance with one aspect of the present invention, a process for manufacturing electronic components is provided. The process comprises the steps of a die-bonding step of adhesively mounting IC chips on a lead frame, a wire-bonding step of connecting bonding pads of the IC chips and the lead frame to each other through lead wires, and a molding step of forming a resin material into an outer package for covering a periphery of each of the IC chips. The lead frame is transferred by means of a carrier means to permit the die-bonding step, wire-bonding step and molding step to be executed in order on a through-line.

In accordance with another aspect of the present invention, an apparatus for manufacturing electronic components is provided. The apparatus comprises a die bonder for adhesively mounting IC chips on a lead frame, a wire bonder for connecting bonding pads of the IC chips and the lead frame to each other through lead wires, a resin molding machine for forming a resin material into an outer package for covering a periphery of each of the IC chips, and a carrier means for carrying the lead frame to the die bonder, wire bonder and resin molding! machine in order on a through-line.

In the present invention constructed as described above, the die-bonding for adhesively mounting the IC chips on the lead frame, the wire-bonding for connecting the bonding pads of the IC chips and the lead frame to each other by means of the lead wires, and the formation of the outer package for covering the periphery of each of the IC chips are successively executed on a through-line, resulting in effectively accomplishing unmanning and diversified small-quantity production such as production of ASIC or the like. Also, the present invention permits execution of each of the steps to be visually inspected through image processing and results of the inspection to be fed back, resulting in on-line inspection being possible.

BRIEF DESCRIPTION OF THE DRAWINGS

These and other objects and many of the attendant advantages of the present invention will be readily appreciated as the same becomes better understood by reference to the following detailed description when considered in connection with the accompanying drawings; wherein.

DETAILED DESCRIPTION OF THE PREFERRED EMBODIMENT

Now, the present invention will be described hereinafter with reference to the accompanying drawings.

Figure 1:
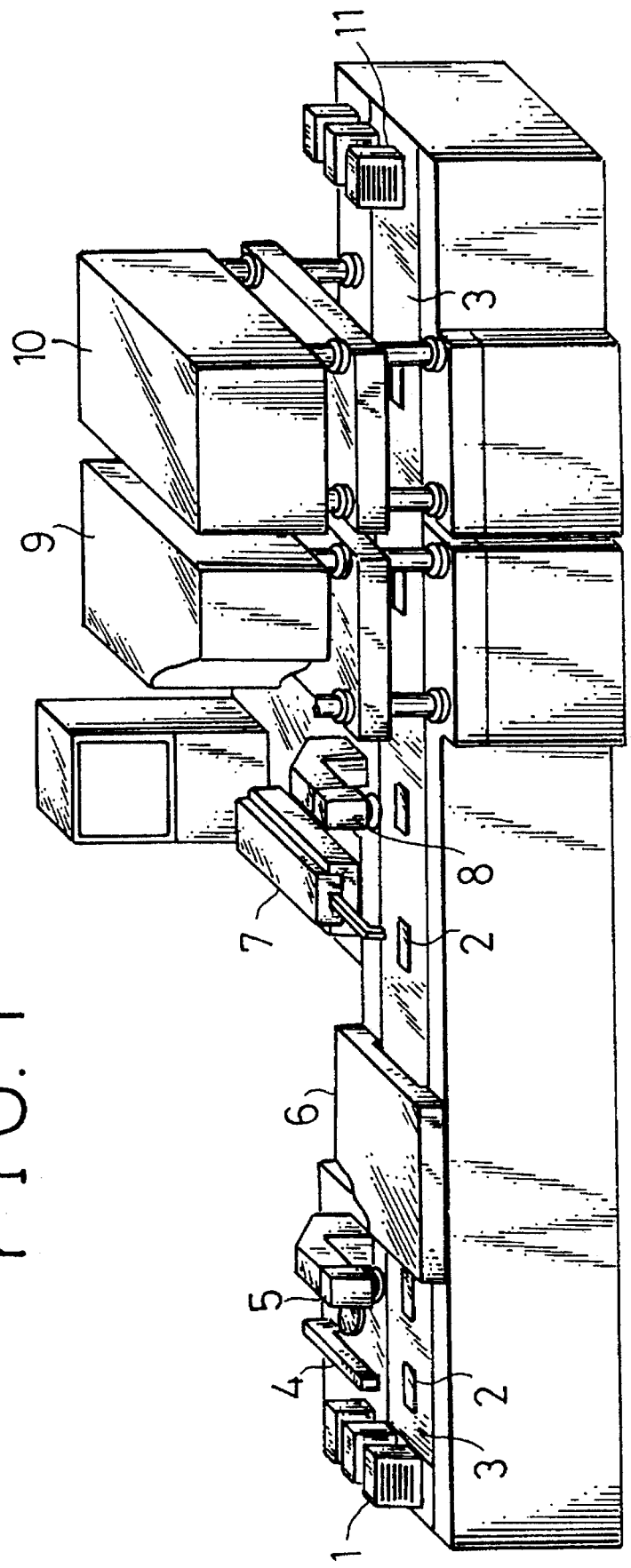
FIG. 1 is a perspective view showing a procedure from a die-bonding step to a molding step in an embodiment of the present invention.
Figure 2:
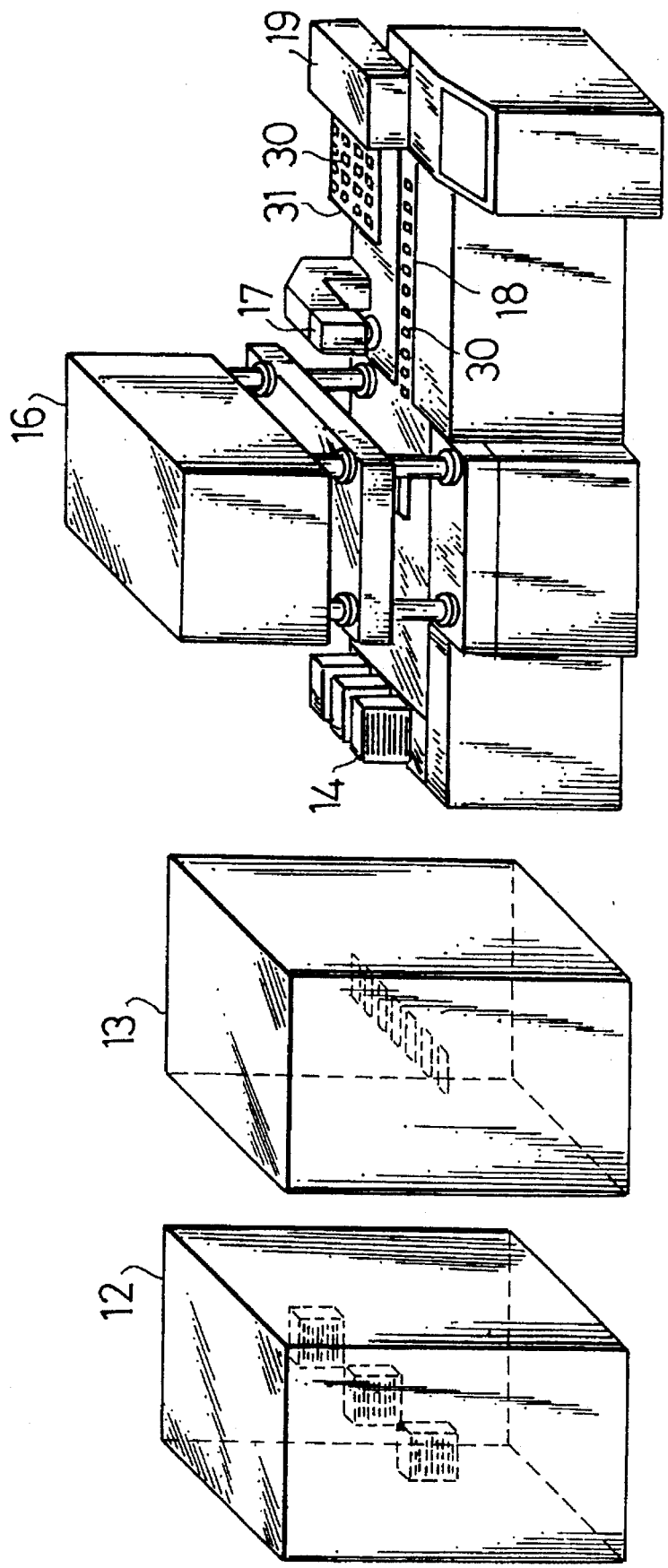
FIG. 2 is a perspective view showing a procedure from an after-curing step to a forming step in an embodiment of the present invention.

FIGS. 1 and 2 illustrate an embodiment of the present invention, wherein FIG. 1 shows a procedure from a die-bonding step to a molding step in the embodiment and FIG. 2 shows a subsequent procedure from an after-curing step to a forming step in the embodiment. In FIG. 1, reference numeral 1 designates a loader for successively feeding lead frames 2 on which IC chips are to be mounted onto a through-line or conveyor 3 serving as a carrier means. Reference numeral 4 is a die bonder for carrying out a die-bonding step for bonding or adhesively mounting IC chips onto the lead frame 2. 5 is a TV camera for confirming workmanship or propriety of the die-bonding. More particularly, the TV camera 5 is adapted to carry out confirmation of execution of the die-bonding step and on-line inspection of the execution by image processing. Then, the lead frame 2 is transferred to a curing oven of a nitrogen atmosphere ($N_2$ curing oven) 6 in which a curing step is carried out for subjecting adhesive used in the die-bonding step to heating in an $N_2$ atmosphere, resulting in curing the adhesive. Subsequently, the lead frame 2 is carried to a wire bonder 7, at which the lead frame 2 is subjected to wire-bonding, and then fed to a location at which a TV camera 8 for confirming workmanship or propriety of execution of the wire-bonding is provided. The TV camera 8 is adapted to carry out confirmation of execution of the die-bonding step and on-line inspection of the execution by image processing. The lead frame is then transported to a resin molding machine 9, wherein a molding step is carried out with respect to the lead frame 2 to form an insulating resin material into an outer package for covering a periphery of each of the IC chips mounted on the lead frame. Reference numeral 10 designates a trimming machine for carrying out a trimming step with respect to the lead frame 2 and 11 is an unloader wherein the lead frame 2 trimmed is taken out from the conveyor 3.

Then, as shown in FIG. 2, the lead frame 2 is fed to an after-curing oven 12 in which it is subjected to after-curing and then transported to a plating unit 13 in which it is subjected to plating. Reference numeral 14 designates a loader for feeding the lead frames 2 plated to a forming machine 16 in order. The forming machine 16 acts to separate, from the lead frame 2 on which integrated circuits each having the outer package are mounted, an unnecessary portion of the lead frame to provide electronic components and form each of the remaining leads of the electronic components into a desired shape. Reference numeral 17 designates a TV camera which functions to confirm workmanship or propriety of the forming step. More particularly, the TV camera 17 is adapted to carry out confirmation of execution of the forming step and on-line inspection of the execution by image processing. Reference numerals 18, 19 and 31 designate a conveyor, an unloader and a tray for storing thereon IC electronic components thus completed, respectively.

Now, the manner of operation of the illustrated embodiment will be described hereinafter.

First, the lead frames 2 are successively fed from the loader 1 onto the conveyor 3 intermittently actuated, so that intermittent movement of the conveyor 3 permits each of the lead frames 2 to be transported to a position below the die bonder 4. Then, the die bonder 4 functions to deposit adhesive on each of die pads of the lead frame 2 which is a portion of the lead frame on which an IC chip is to be mounted and then, as shown in FIG. 3, mount IC chips 20 on the lead frame 2 in turn.

Figure 3:
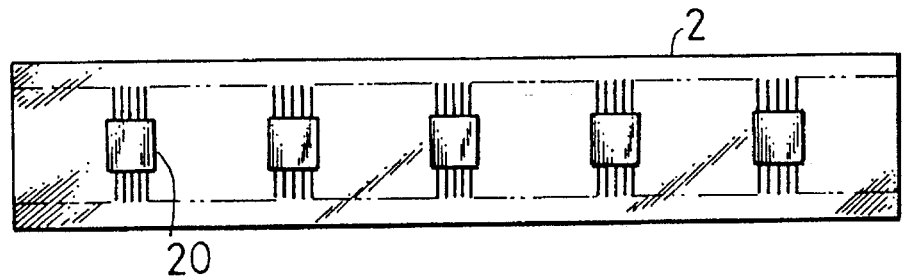
FIG. 3 is a schematic view showing a lead frame which has been subjected to a die-bonding step.

The lead frame 2 thus mounted thereon with the IC chips 20 as shown in FIG. 3 is then transferred to a position below the TV camera 5. An image of the lead frame and an image of a peripheral region of each of the IC chips 20 which are obtained by the TV camera 5 are fed to an image processing unit, in which each of the images are subjected to image processing, resulting in an image signal being formed by, for example, binary processing.

Figure 4:
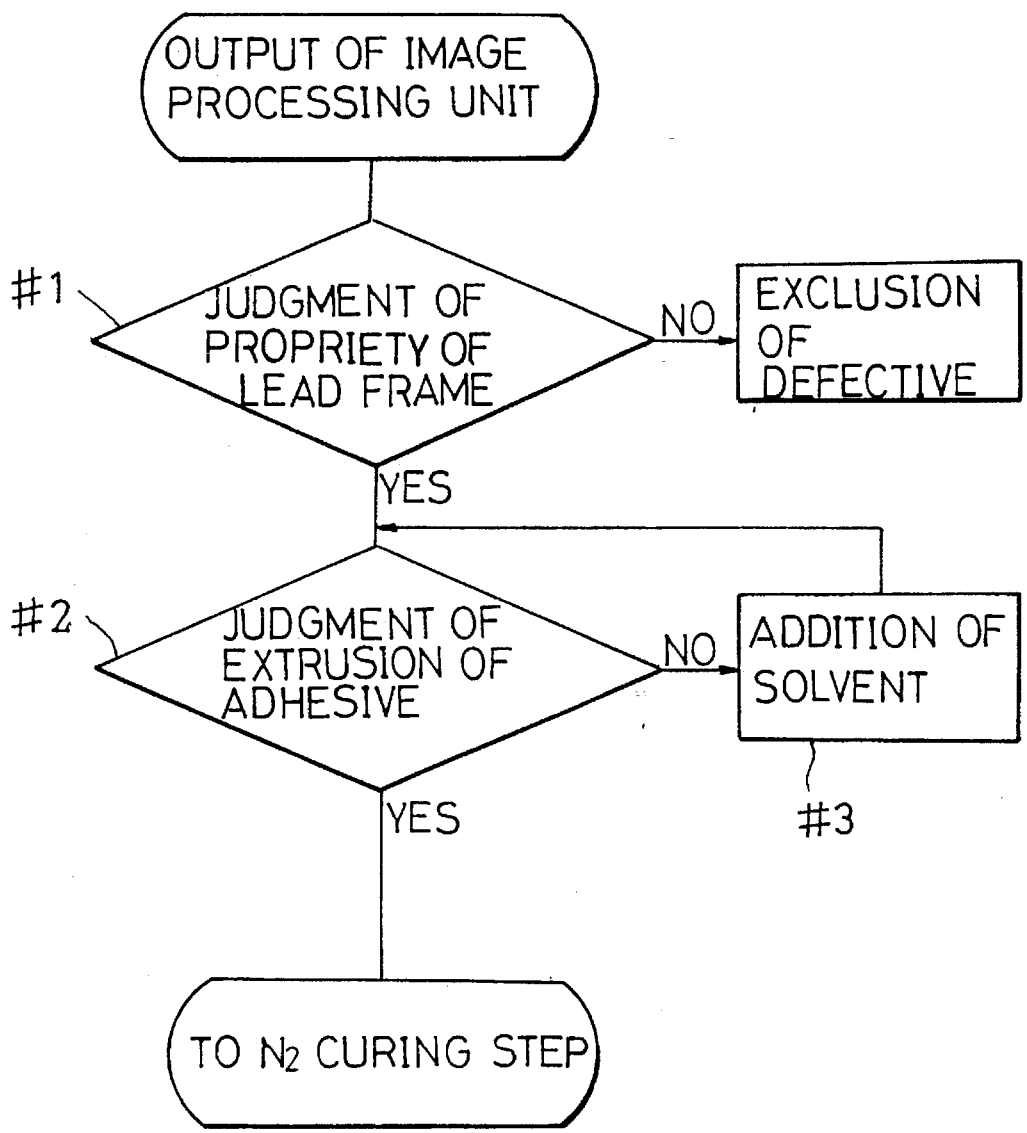
FIG. 4 is a flow chart showing process feedback control for a die-bonding step.

FIG. 4 is a flow chart showing a procedure of process feedback control carried out using the images obtained through the TV camera 5 in a control section fed with the output or image signal of the image processing unit. More particularly, in the control section, a lead frame inspection step #1 is carried out to determine or judge propriety of the lead frame 2. The lead frame 2 which has been judged to be defective is removed from the conveyor 3. Then, a die-bonding inspection step #2 is carried out to judge propriety of extrusion or runout of the adhesive which occurs when the IC chip 20 is mounted on each of the die pads of the lead frame 20. When the extrusion is judged to be adequate or suitable, the lead frame 2 is fed to the $N_2$ curing oven 6, wherein the curing step is carried out. More particularly, intermittent movement of the conveyor 3 permits the lead frame 2 having the IC chips mounted thereon to be fed into the $N_2$ curing oven 6, wherein the adhesive is heated in an $N_2$ atmosphere, resulting being cured. Whereas, when the extrusion of the adhesive is excessively reduced due to a decrease in flowability of the adhesive or an increase in viscosity thereof, a solvent adding step #3 is executed. More particularly, in the step #3, it is carried out to feed the die bonder 4 with solvent to adjust flowability of the adhesive to an appropriate level. The above-described images obtained by the TV camera 5 are subjected to image processing in the image processing unit to confirm a position of each of the leads of the lead frame 2 for the purpose of getting ready for the subsequent wire-bonding step.

Figure 5A:
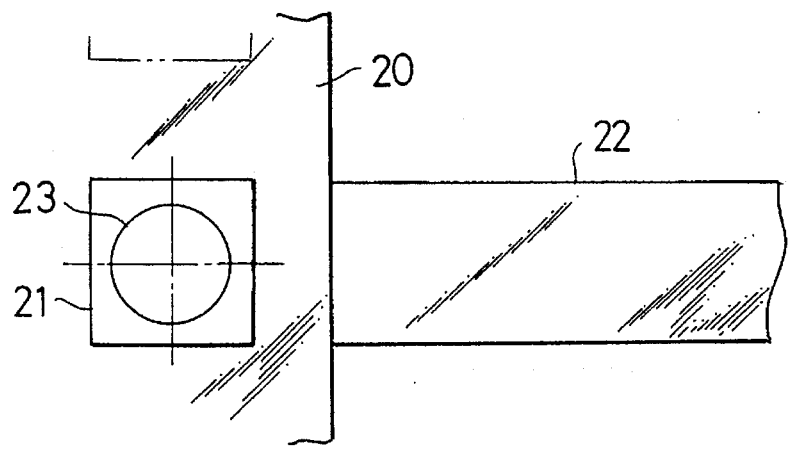
FIGS. 5A to 5C each are a schematic view showing a positional relationship between a bonding pad and a wire bonder in a wire-bonding step.
Figure 5B:
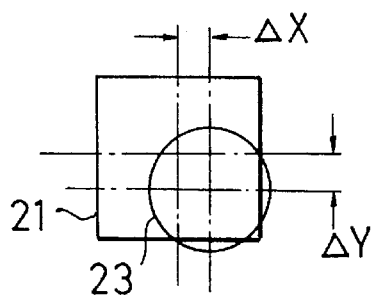
Figure 5C:
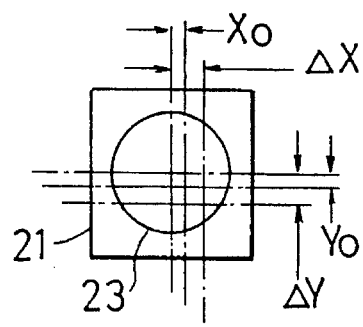

The lead frame 2 having the IC chips mounted thereon which has been subjected to the curing step in the $N_2$ curing oven 6 is then fed to a position below the wire bonder 7 by means of the conveyor 3. The wire bonder 7 executes the wire-bonding step with respect to the lead frame 2 intermittently stopped due to intermittent movement of the conveyor 3. More particularly, as shown in FIGS. 5A to 5C, a lead wire is provided so as to establish connection between each of bonding pads 21 of the IC chip 20 and a lead 22 on the side of the lead frame 2. The bonding pad 21 may comprise an electrode of aluminum or the like formed on a silicon wafer. At this time, the wire-bonding is carried out utilizing results of the above-described processing of the images obtained by the TV camera 5 which has been carried out for confirming the position of each of the leads. The lead frame 2 which has been thus subjected to the wire-bonding treatment is then transferred to a position below the TV camera 8 by means of the conveyor 3. An image of a periphery of each of the bonding pads of the IC chip 20 obtained through the TV camera 8 is fed to the image processing unit, resulting in an image signal being produced by, for example, binary processing. In each of FIGS. 5A to 5C, a circle designated at reference numeral 23 indicates a diameter of a ball jointed to the bonding pad 21 due to melting of an end of the lead wire caused by a tool for the wire bonder 7. FIG. 5A shows an ideal state at which a center of the pad and a center of the tool are coincided with each other. FIG. 5B shows that an environmental change due to thermal expansion or the like causes the centers of the pad and tool to be deviated from each other by a distance of $\Delta X$ in an X direction and a distance of $\Delta Y$ in a Y direction. FIG. 5C shows correction of the center of the tool carried out when the positional deviations $\Delta X$ and $\alpha Y$ between the center of the pad and that of the tool exceed tolerances $X_O$ and $Y_O$, respectively.

Figure 6:
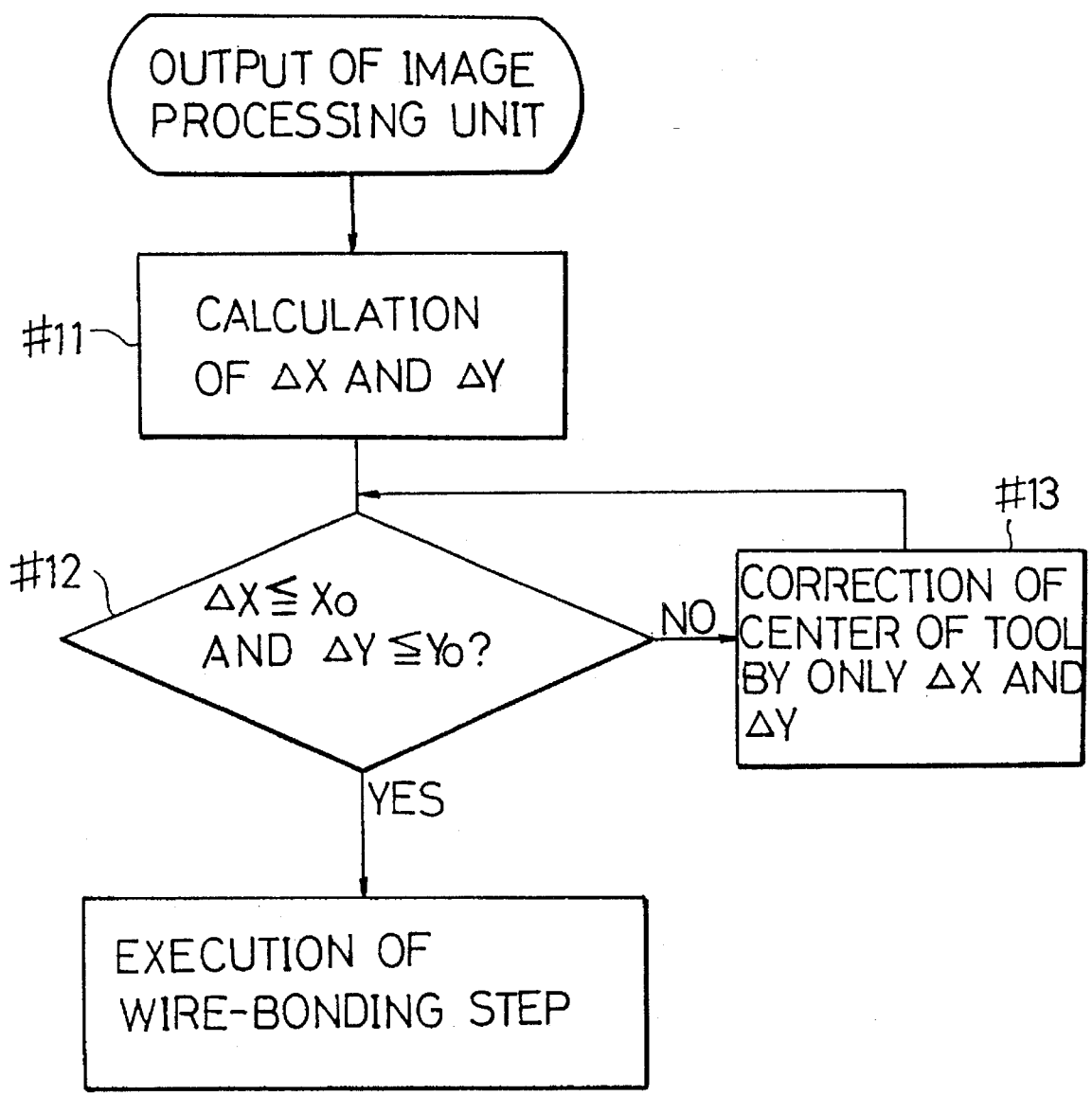
FIG. 6 is a flow chart showing process feedback control for a wire-bonding step.

FIG. 6 is a flow chart showing a procedure of process feedback control carried out using images obtained through the TV camera 8 in the above-described control section fed with the output or image signal of the above-described image processing unit. First, a $\Delta X$ and $\Delta Y$ calculating step #11 is executed using the output or image signal of the image processing unit. More particularly, the step #11 is carried out to determine the positional deviations $\Delta X$ and $\Delta Y$ between the center of the bonding pad 21 and that of the tool of the wire bonder 7 (the center of the circle 23). Then, a judgment step #12 is executed to judge whether or not the deviations $\Delta X$ and $\Delta Y$ are within the tolerances $X_O$ and $Y_O$. When $\Delta X$ is equal to or below $X_O$ and $\Delta Y$ is equal to or below $Y_O$, the wire bonding step is executed. When $\Delta X$ exceeds $X_O$ and/or $\Delta Y$ exceeds $Y_O$, a tool position correcting step #13 is executed, so that the position of the tool of the wire bonder 7 is subjected to subtraction of $\Delta X$ and $\Delta Y$ to coincide the center of the ball and that of the tool with each other.

The lead frame 2 which has been subjected to the wire-bonding treatment is then fed to the resin molding machine 9, wherein the molding step is carried out to form an insulating resin material into an outer package for covering each of the IC chips 20 on the lead frame 2. The lead frame 2 thus formed thereon with the outer package is transferred to the trimming machine 10 while being carried on the conveyor 3, wherein the trimming step of removing, from the lead frame 2, an unnecessary portion thereof. However, in the step, the lead frame 2 is not yet separated into individual integrated circuits, so that a plurality of the integrated circuits are kept integral with each other. Thereafter, the lead frame 2 is transferred to a discharge end of the conveyor 3, at which it is taken out from the conveyor by means of the unloader 11.

The lead frame 2 taken out from the conveyor 3 by means of the unloader 11 is subsequently fed to the after-curing oven 12 wherein the after-curing step for drying the resin forming the outer package of the lead frame 2 to cure it is carried out. The lead frame 2 thus cured is transferred to the plating unit 13 wherein the lead frame 2 is plated, and then it is fed to the forming machine 16 by means of the loader 14, in which the forming step is carried out with respect to the lead frame 2. More particularly, the forming machine 16 functions to remove, from the lead frame 2, an unnecessary portion of the lead frame to separate integrated circuits 30 formed on the lead frame from each other and form leads of each of the integrated circuits into a predetermined shape.

The integrated circuits 30 thus formed each are then transferred to a position below the TV camera 17 while being carried on the conveyor 18.

The TV camera 17 provides an image of the leads of the integrated circuit 30, which image is subsequently fed to the image processing unit, resulting in an image signal being produced by binary processing. The image signal permit the control section to inspect a configuration of each of the leads, its dimensions, its bending, its arrangement, intervals between the leads, and the like, so that propriety of each of the integrated circuits is judged. Defective integrated circuits are separated from non-defective ones. Thereafter, the non-defective integrated circuits are transferred to the tray 31 by means of the unloader 19 and then stored.

As can be seen from the foregoing, the present invention permits the die-bonding step, wire-bonding step and molding step to be successively executed on a through-line, to thereby contribute to labor saving. Also, the present invention can effectively accommodated such diversified small-quantity production as seen in production of ASIC or the like.

While a preferred embodiment of the invention has been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. A process for manufacturing electronic components comprising the steps of:

die-bonding IC chips having bonding pads on a lead frame with a die-bonder by adhesively mounting said IC chips on said lead frame;

wire-bonding said bonding pads of said IC chips to said lead frame with a wire-bonder by connecting lead wires from said bonding pads to said lead frame;

molding a resin material into an outer package with a resin molding machine for covering a periphery of each of said IC chips;

transferring said lead frame during the manufacturing process by a single, continuous conveyor belt extending continuously from said die-bonder to said wire-bonder to said resin molding machine for continuously conveying said lead frame in order through said die-bonding step, said wire-bonding step and said molding step;

observing said electronic components at at least one position on said conveyor belt with automated inspection means for inspecting and forming images of said electronic components after completion of at least one of said die-bonding, wire-bonding and molding steps, said images being fed back to image processing means for verification of at least one of said die-bonding step, wire-bonding step, and molding step; and observing the degree of runout extrusion of the adhesive used for adhesively mounting said IC chips in said die-bonding step and adding a solvent to said adhesive to adjust the flowability of said adhesive.

2. A process as claimed in claim 1, further comprising the step of removing a defective lead frame observed in said observing step.

3. A process as claimed in claim 1, further comprising the step of observing the position of said bonding pads of said IC chips and the step of positionally adjusting a bonding tool used to connect said lead wires and said bonding pads in order to align said bonding pads and said bonding tool prior to said wire bonding step.

4. An apparatus for manufacturing electronic components comprising:

- a die-bonder for adhesively mounting IC chips having bonding pads onto a lead frame;
- a wire-bonder for connecting said bonding pads of said IC chips to said lead frame by means of lead wires;
- a resin molding machine for forming a resin material into an outer package for covering a periphery of each of said IC chips;
- a single, continuous conveyor belt extending continuously from said die-bonder to said wire-bonder to said resin molding machine for continuously carrying said lead frame in order through said die-bonder, said wire-bonder and said resin molding machine;
- automated inspection means for inspecting and forming images of said electronic components at least one position on said carrier means, said images being fed back to image processing means for verification of the operation of at least one of said die-bonder, wire-bonder and resin molding machine on said electronic components; and
- means for adding a solvent to adjust the flowability of the adhesive applied by said die-bonder in response to the degree of runout extrusion of said adhesive observed by said inspection means.

5. An apparatus as claimed in claim 4, further comprising means for removing a defective lead frame observed by said inspection means.

6. An apparatus as claimed in claim 4, further comprising means for positionally adjusting a bonding tool used to connect said lead wires to said bonding pads in response to the position of said bonding pads on said IC chips observed by said inspection means to align said bonding pads and said bonding tool prior to bonding.

7. An apparatus as claimed in claim 4, wherein said inspection means comprises at least one TV camera electrically connected to said image processing means.

* * * * *

UNITED STATES PATENT AND TRADEMARK OFFICE
CERTIFICATE OF CORRECTION

PATENT NO. : 5,549,716
DATED : August 27, 1996
INVENTOR(S) : Takahashi et al.

It is certified that error appears in the above-indentified patent and that said Letters Patent is hereby corrected as shown below:

Column 2, line 42, delete "!".

Column 5, line 20, "$\alpha$" should read --$\Delta$--.

Signed and Sealed this

Twenty-fourth Day of December, 1996

Attest:

BRUCE LEHMAN

Attesting Officer     Commissioner of Patents and Trademarks